United States Patent
Yamamoto

(10) Patent No.: US 7,687,864 B2
(45) Date of Patent: Mar. 30, 2010

(54) SEMICONDUCTOR INTEGRATED CIRCUIT DEVICE, AND APPARATUS AND PROGRAM FOR DESIGNING SAME

(75) Inventor: Hiroshi Yamamoto, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 583 days.

(21) Appl. No.: 11/371,078

(22) Filed: Mar. 9, 2006

(65) Prior Publication Data

US 2006/0202231 A1 Sep. 14, 2006

(30) Foreign Application Priority Data

Mar. 10, 2005 (JP) .............................. 2005-067127

(51) Int. Cl.
*H01L 27/10* (2006.01)
(52) U.S. Cl. ..................... 257/371; 257/204; 257/207
(58) Field of Classification Search ......... 257/371–373, 257/204, 207, E27.108, 368–369, 375–376
See application file for complete search history.

(56) References Cited

U.S. PATENT DOCUMENTS

| | | | | |
|---|---|---|---|---|
| 4,523,217 A | * | 6/1985 | Jibu .......................... 327/514 |
| 5,202,907 A | * | 4/1993 | Yonemoto ..................... 377/60 |
| 5,323,043 A | * | 6/1994 | Kimura et al. .............. 257/371 |
| 5,373,476 A | * | 12/1994 | Jeon ........................... 365/226 |
| 5,473,183 A | * | 12/1995 | Yonemoto .................. 257/371 |
| 5,838,047 A | * | 11/1998 | Yamauchi et al. ........... 257/372 |
| 6,023,186 A | * | 2/2000 | Kuroda ....................... 327/534 |
| 6,104,072 A | * | 8/2000 | Hirota ........................ 257/405 |
| 6,285,052 B1 | * | 9/2001 | Draper ........................ 257/300 |
| 6,376,870 B1 | * | 4/2002 | Carpenter et al. ........... 257/288 |

(Continued)

FOREIGN PATENT DOCUMENTS

| | | |
|---|---|---|
| JP | 2000-124318 A | 4/2000 |
| JP | 2003-309178 | 10/2003 |
| JP | 2004-319855 | 11/2004 |

OTHER PUBLICATIONS

Chinese Office Action dated Feb. 6, 2009 with Partial English-Language Translation of the Japanese-Language Translation of the Chinese Office Action.

*Primary Examiner*—Wai-Sing Louie
*Assistant Examiner*—Bilkis Jahan
(74) *Attorney, Agent, or Firm*—McGinn IP Law Group, PLLC

(57) ABSTRACT

Disclosed are a design method and apparatus in which information regarding a cell is input, the cell having taps in a substrate surface, for supplying the potentials of respective ones of wells in which active elements are formed, and source diffusion regions in the substrate surface, conductivity types thereof being opposite those of the wells. The taps are converted to conductivity types identical with those of the source diffusion regions to obtain source regions and freely set the well potentials of the cell to any potentials. If the cell is one having shorting portions electrically connecting taps and sources and the shorting portions are diffusion regions of the same conductivity type as that of the taps, then the shorting portions are converted to conductivity types identical with those of the source diffusion regions to obtain source regions.

20 Claims, 12 Drawing Sheets

U.S. PATENT DOCUMENTS

| | | | |
|---|---|---|---|
| 6,403,992 B1 * | 6/2002 | Wei | 257/204 |
| 6,750,527 B1 * | 6/2004 | Momohara | 257/511 |
| 6,784,500 B2 * | 8/2004 | Lemkin | 257/368 |
| 7,002,232 B2 * | 2/2006 | Momohara | 257/499 |
| 2003/0173626 A1 * | 9/2003 | Burr | 257/369 |
| 2003/0173627 A1 * | 9/2003 | Burr | 257/369 |

* cited by examiner

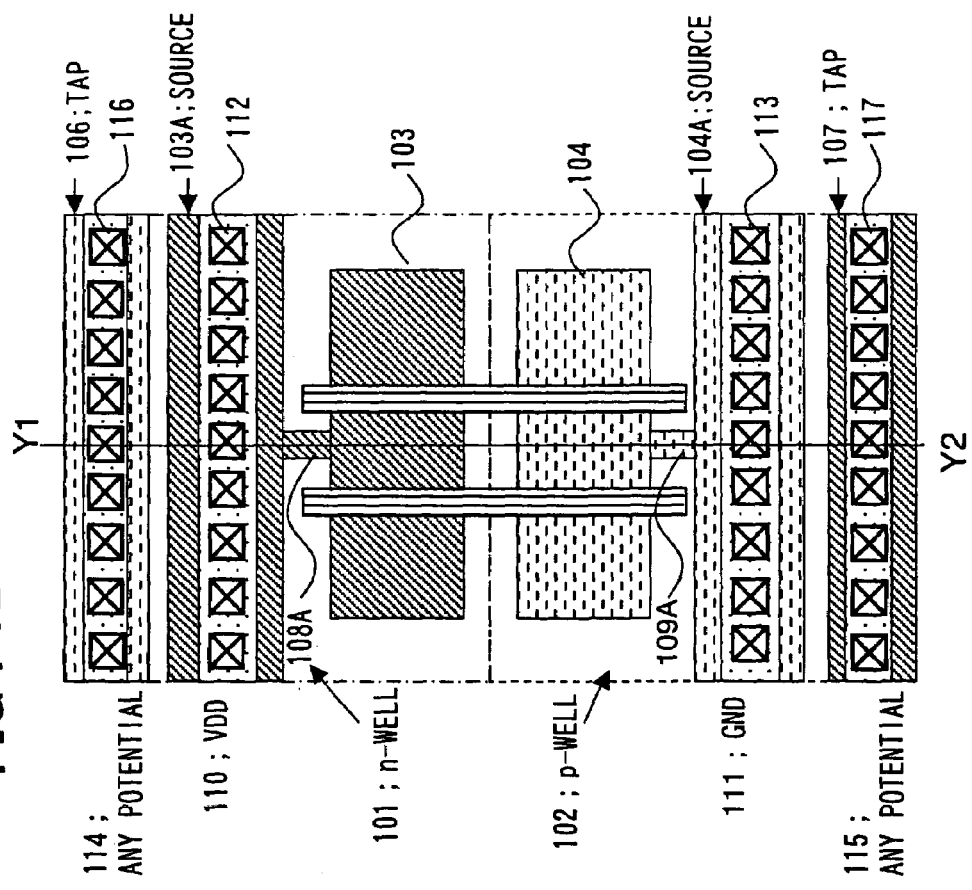
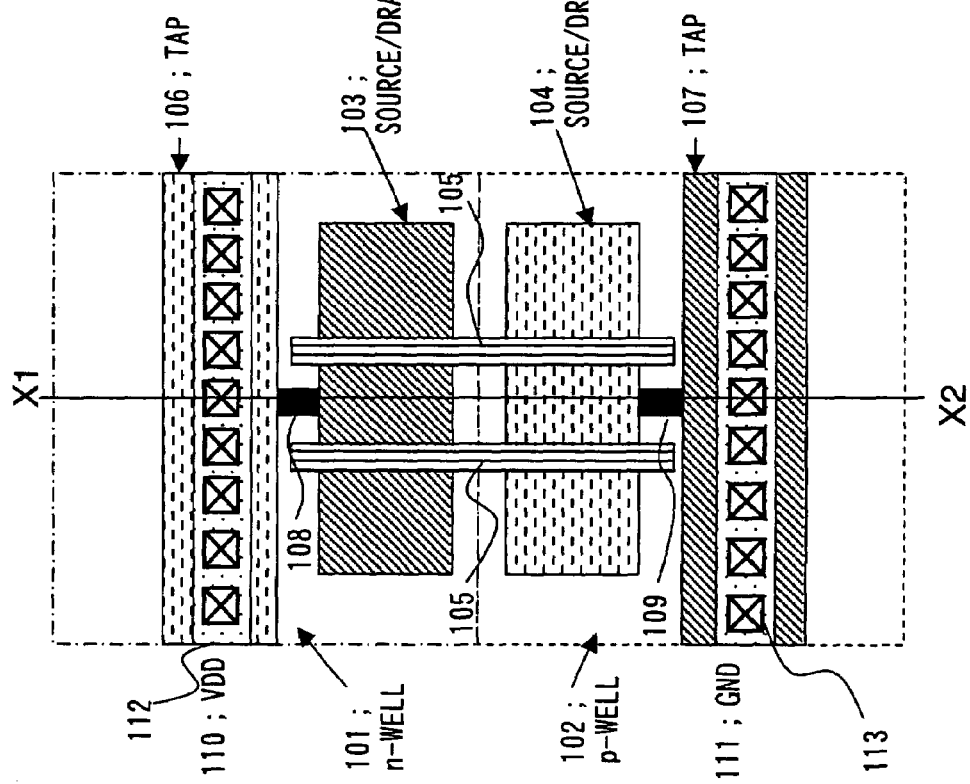

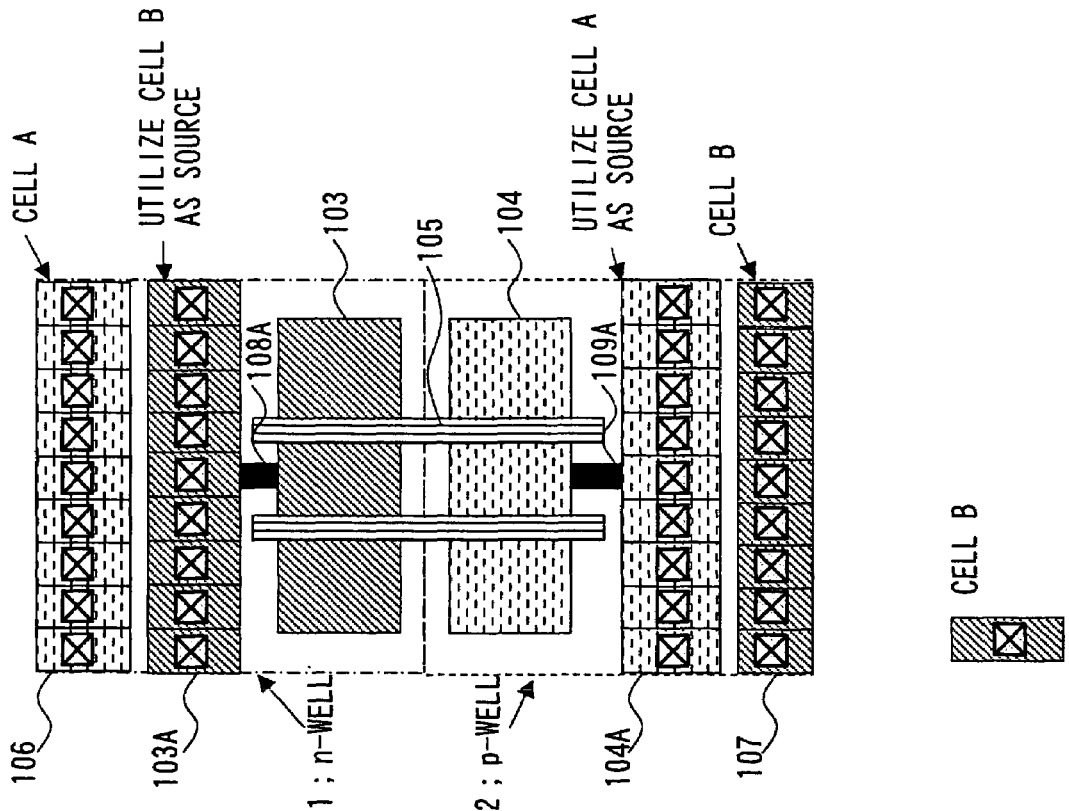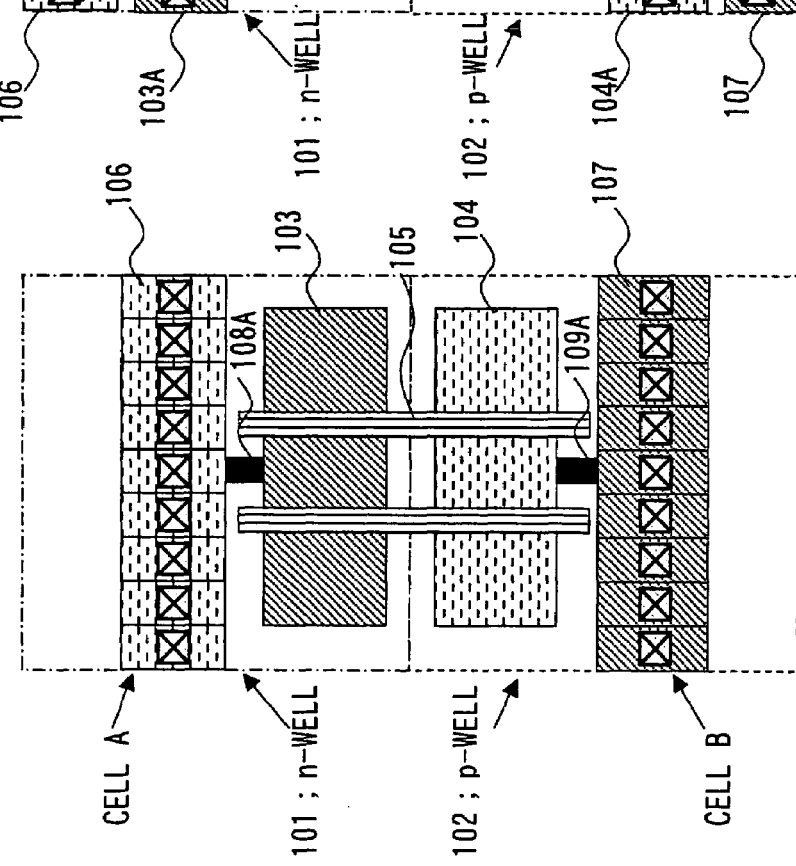

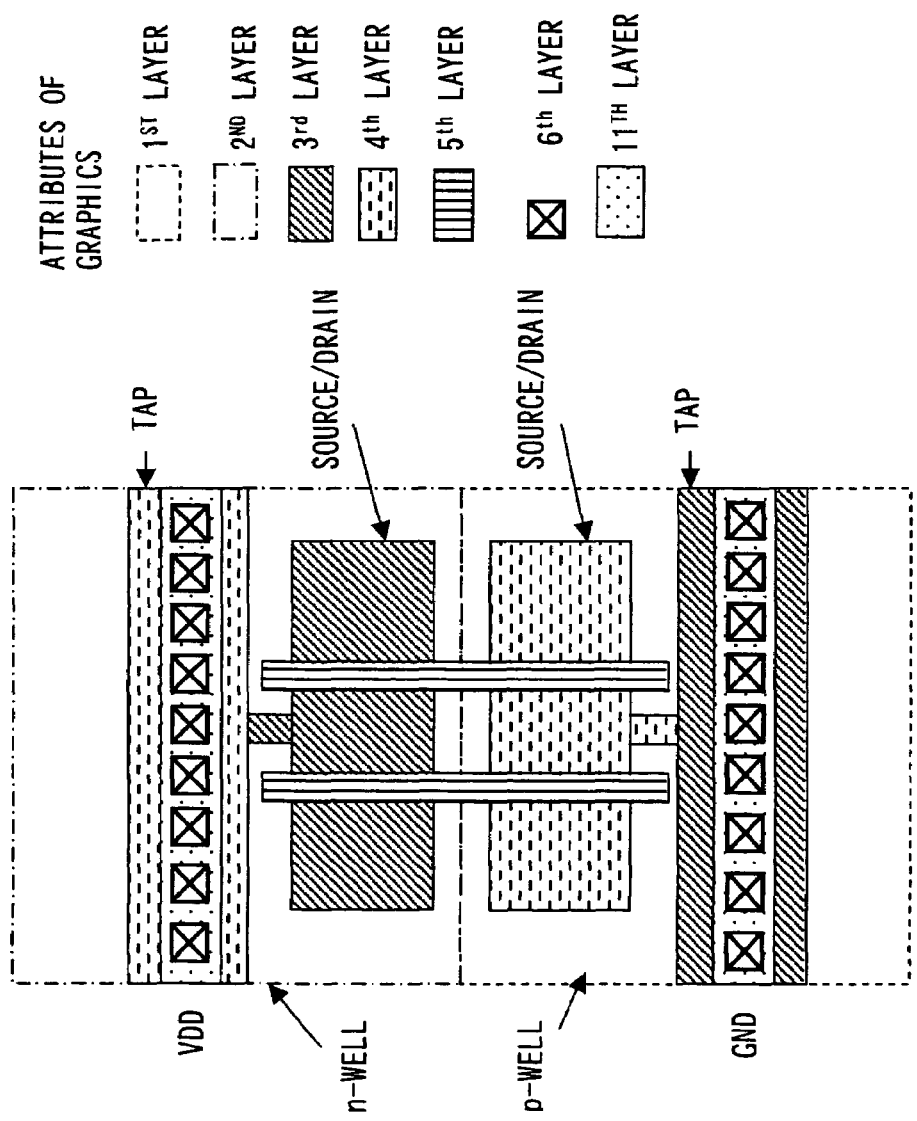

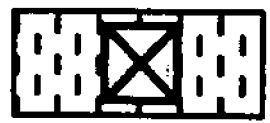
FIG. 8A  CELL D
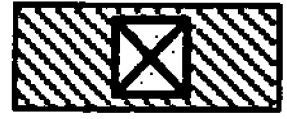
FIG. 8B  CELL E

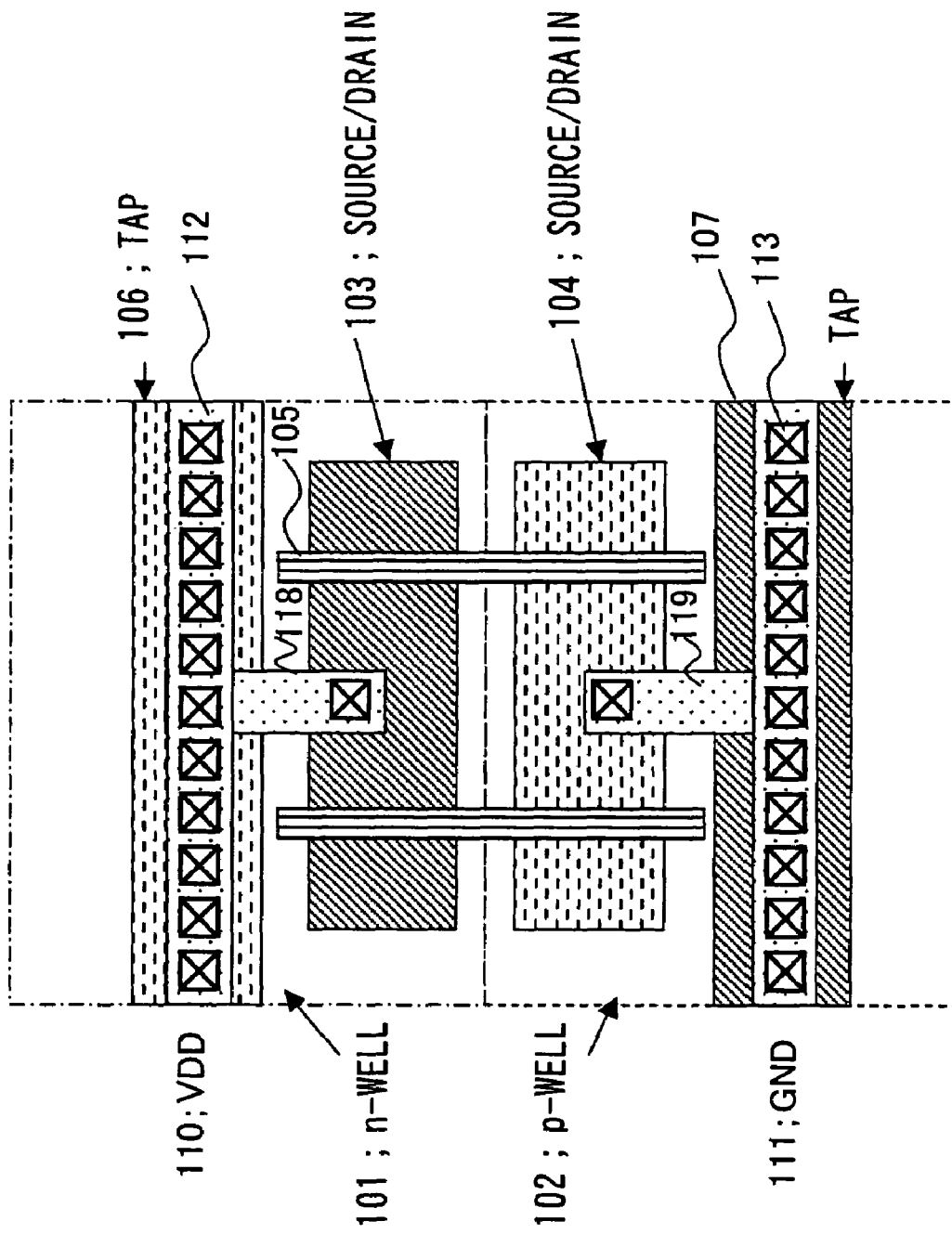

US 7,687,864 B2

SEMICONDUCTOR INTEGRATED CIRCUIT DEVICE, AND APPARATUS AND PROGRAM FOR DESIGNING SAME

FIELD OF THE INVENTION

This invention relates to a semiconductor integrated circuit device and to a method, apparatus and program for designing this semiconductor integrated circuit device. More particularly, the invention relates to a semiconductor integrated circuit device in accordance with the standard cell method, and to a method, apparatus and program for designing the cell.

BACKGROUND OF THE INVENTION

In layout design of a semiconductor device using a library of standard cells or the like, a technique used heretofore involves adopting the power-supply potential as the potential of a substrate or well or setting the substrate or well potential to a potential different from that of the power-supply voltage in order to control the threshold value of a MOS transistor. This technique relies upon a method in which a tap for supplying the well potential is placed within a cell or in which a tap cell is disposed appropriately between cell rows. The specification of Patent Document 1 describes an arrangement in which when a plurality of cells having impurity diffusion regions (which are electrically connected at mutually adjacent cells) for supplying a substrate or well potential different from the power-source potential are arranged out in series, a power supply reinforcing cell for providing reinforced power supply is disposed between mutually adjacent cells. The power supply reinforcing cell has an impurity diffusion region that electrically connects the impurity diffusion regions possessed by the cells adjacent thereto, and a power supply interconnect provided in an interconnect layer provided on an upper layer on the impurity diffusion region and is electrically connected to the impurity-diffusion region. A source diffusion region is connected to the interconnect line of a power-supply interconnect layer via a contact. Further, the specification of Patent Document 2 discloses a layout method of deciding the proper number of taps in a well and reducing the number of taps to make possible high-density integration.

[Patent Document 1] Japanese Patent Kokai Publication No. JP-P2003-309178A

[Patent Document 2] Japanese Patent Kokai Publication No. JP-P2004-319855A

FIG. 12 is a diagram illustrating a typical example of the structure (twin-well structure) of a cell equipped with well-potential supply taps. An n-well 101 is provided with a source/drain 103 comprising a P+ diffusion region (referred to as a "P+ diffusion layer"), an a p-well 102 is provided with a source/drain 104 comprising an N+ diffusion region (referred to as a "N+ diffusion layer"). The n-well 101 and p-well 102 are provided with respective taps 106 and 107 comprising N+ and P+ diffusion regions, respectively, and are connected to power-supply (VDD) and ground (GND) interconnects (line) 110 and 111 arranged in a metal interconnect layer via contacts 112 and 113, respectively. The potentials of the n-well 101 and p-well 102 are fixed at the power supply VDD and ground GND. Further, the power-supply potential and ground potential are supplied to the sources of the source/drains 103 and 104 via interconnects 118 and 118 connected to the power supply (VDD) and ground (GND) interconnects 110 and 111, respectively. Gate electrodes 105 comprising polysilicon or the like are placed on a substrate between the diffusion regions of the source and drain via gate oxide films.

Each of the two gate electrodes 105 forms a common gate of a P-channel MOS transistor within the n-well 101 and an N-channel MOS transistor within the p-well 102. A CMOS inverter is obtained by connecting the drain of the P-channel MOS transistor within the n-well 101 and the drain of the N-channel MOS transistor within the p-well 102.

In order to make it possible to supply any well potential to such a cell, it is necessary to design anew a cell that is capable of supplying tap potential that is independent of VDD and GND. There are also cases where use is made of a connection (referred to as a "batting connection" that is electrically short-circuited within the cell by disposing portions of diffusion regions (tap and source) of mutually different conductivity types in such a manner that they contact each other. With a batting connection, only the tap (source) is connected to metal interconnect for current feed, and potential is applied to the source (tap) from the tap (source) by the batting connection. Consequently, if it is attempted to alleviate new design load through a method of providing a layout that eliminates the tap within the cell and supplies any well potential separately, a cell having a batting connection is such that owing to elimination of the tap, the corresponding source floats electrically and the cell cannot function normally. Thus, it is necessary to design the cell afresh in any case. Design and verification require labor and greater burden.

SUMMARY OF THE DISCLOSURE

The inventor has independently discovered an entirely new design method, apparatus and semiconductor device that utilize cell library resources effectively to make it possible to convert a cell for which the well potential is the power-supply potential to a cell that supplies any well potential.

A semiconductor integrated circuit device according to one aspect of the present invention has a tap, which supplies the potential of a well in which an active element is formed, provided in a semiconductor substrate surface. The tap has a conductivity type identical with that of a source diffusion region.

A semiconductor integrated circuit device according to another aspect of the present invention comprises: first and second diffusion regions of identical conductivity type disposed in opposition in a surface of a substrate in such a manner that a region in which a gate is disposed is interposed therebetween; a third diffusion region, which is of a conductivity type identical with that of said first and second diffusion regions, disposed in the surface of the substrate and spaced away from said first and second diffusion regions; and a shorting portion for electrically connecting said first diffusion region and said third diffusion region. Preferably, in the semiconductor integrated circuit device according to the present invention, said shorting portion comprises a fourth diffusion region disposed in the surface of the substrate. Preferably, in the semiconductor integrated circuit device according to the present invention, said third diffusion region is supplied with a power-supply potential or ground potential from an interconnect layer via a contact.

A semiconductor integrated circuit device according to the another aspect of the present invention, a second cell including: a well formed in a substrate; a tap for supplying a potential of said well; and a source diffusion region of an active element formed in said well, the conductivity type of said tap being identical with that of said source diffusion region, said second cell being produced by making the conductivity type of a tap of a first cell in a cell library identical with that of a source diffusion region of the first cell, said a first cell including: a well formed in a substrate; the tap for supplying a potential of said well; and the source diffusion region of an active element formed in said well and having the conductivity type opposite that of the well.

Preferably, in the semiconductor integrated circuit device according to the present invention, said second cell further comprises another tap for supplying the potential of said well in said second cell, at a position separate from that of said tap replaced by said source diffusion region.

Preferably, the semiconductor integrated circuit device according to the present invention, further comprises a cell having a tap, which supplies the potential of said well, separate from said second cell.

A semiconductor integrated circuit device according to the another aspect of the present invention, comprises: a first cell having a well formed in a substrate, a tap for supplying a potential of said well and a source diffusion region of an active element formed in said well and having the conductivity type opposite that of the well; and a second cell, which, with respect to the first cell, has the conductivity type of said tap made identical with that of said source diffusion region. Preferably, in the semiconductor integrated circuit device according to the present invention, said tap in said first cell comprises one or a plurality of tap cells each having an impurity diffusion region and a contact; and said second cell is such that said tap cell in said first cell is replaced by a substitute tap cell having an impurity diffusion region the conductivity type of which is identical with that of said source diffusion region, and a contact.

Preferably, in the semiconductor integrated circuit device according to the present invention, in said first cell, an impurity diffusion region that constructs said tap is disposed so as to contact said source diffusion region at least at one portion thereof. An interconnect that is laid on an interconnect layer on an upper layer of the substrate and that supplies said source diffusion region with power-supply potential is disposed so as to overlap said source diffusion region and seen from above the substrate; the interconnect that supplies said source diffusion region with the power-supply potential and said source diffusion region are disposed to extend over a plurality of mutually adjacent cells; and a tap that supplies the potential of said well is freely supplied with a potential that is different from the potential supplied to said source diffusion region.

A method of designing a semiconductor integrated circuit according to another aspect of the present invention comprises steps of inputting a cell having a tap, which supplies the potential of a well in which an active element is formed, provided in a semiconductor substrate surface; and converting the tap of the cell to a conductivity type identical with that of a source diffusion region; wherein the well potential of the cell is set freely to any potential.

A method of designing a semiconductor integrated circuit by computer, according to the present invention, comprises the steps of:

inputting cell information from cell library storage means in which the cell information is stored, the cell information having a tap that supplies potential of a well in which an active element is formed, and a source diffusion region having a conductivity type opposite that of the well;

converting, with regard to the cell, the tap to a conductivity type identical with that of the source diffusion region; and storing the cell, obtained by the conversion, in extended cell library storage means as an extended cell in which well potential of the cell is freely set to any potential.

Preferably, in the method according to the present invention, in the conversion of the tap of the cell to the conductivity type identical with that of the source diffusion region, the extended cell is generated by replacing attribute information of the tap of the cell with attribute information of the source diffusion region.

Preferably, in the method according to the present invention, if said cell is a cell having a shorting portion for connecting the tap and the source diffusion region and the shorting portion is a diffusion region having a conductivity type identical with that of the tap, then the shorting portion is converted to a conductivity type identical with that of the source diffusion region to obtain a source region.

An apparatus for automatically designing a semiconductor integrated circuit according to a further aspect of the present invention comprises:

means for inputting, from a library, cell information of a cell having a tap, for supplying the potential of a well in which an active element is formed, provided in a semiconductor substrate surface; and means for generating a new cell by converting the tap of the cell to a conductivity type identical with that of a source diffusion region. In the present invention, a tap for supplying the well potential may be separately provided, and the well potential may be set freely to any potential. An apparatus for automatically designing a semiconductor integrated circuit, according to the present invention, comprises:

a cell library storage unit for storing cell information;

an extended cell library storage unit for storing information of an extended cell in which well potential of the cell has been freely set to any potential; and a conversion unit, which inputs cell information from said cell library storage unit, for determining whether the cell is a cell having a tap that supplies potential of a well in which an active element is formed, and if the cell is a cell having said tap, converting the tap of the cell to a conductivity type identical with that of a source diffusion region, and storing information of the cell obtained by the conversion in said extended cell library unit as an extended cell in which well potential of the cell has been freely set to any potential. Preferably, in the conversion of the tap of the cell to the conductivity type identical with that of the source diffusion region, said conversion unit generates the extended cell by replacing attribute information of the tap of the cell with attribute information of the source diffusion region. Preferably, the apparatus according to the present invention, further comprises a substitution cell storage unit for storing substitution cells each comprising an impurity diffusion region of a prescribed conductivity type and a contact and said conversion unit replaces the tap with a source diffusion region using a substitution cell of said substitution cell storage means. Preferably, a tap for supplying the well potential is separately provided, and the sell potential is freely set to any well potential. Preferably, in the present invention, an interconnect that is laid on an interconnect layer on an upper layer of a substrate and that supplies said source diffusion region with power-supply potential is disposed so as to overlap said source diffusion region and seen from above the substrate; an interconnect that supplies said source diffusion region with the power-supply potential and said source diffusion region are disposed to extend over a plurality of mutually adjacent cells; and a tap that supplies the potential of said well is freely supplied with a potential that is different from the potential supplied to said source diffusion region. Preferably, in the present invention, if the cell is a cell having shorting portion for connecting the tap and the source diffusion region and the shorting portion is a diffusion region having a conductivity type identical with that of the tap, then said conversion unit converts the shorting portion to a conductivity type identical with that of the source diffusion region to thereby obtain a source region.

A computer program according to a further aspect of the present invention causes a computer, which implements an apparatus for automatically designing a semiconductor integrated circuit, to execute the following processing: processing for inputting, from a library, cell information of a cell having a tap, which supplies the potential of a well in which an active element is formed, provided in a semiconductor substrate surface; and processing for generating a new cell by converting the tap of the cell to a conductivity type identical with that of a source diffusion region.

A computer program according to a further aspect of the present invention causes a computer which implements an apparatus for automatically designing a semiconductor integrated circuit to execute the following processing, said apparatus having a cell library storage unit for storing cell information and an extended cell library storage unit for storing information of an extended cell in which well potential of the cell has been freely set to any potential:

processing for inputting layout information of a cell from said cell library storage unit and determining whether the cell is a cell having a tap, which supplies potential of a well in which an active element is formed, provided in a substrate surface; and if the cell is a cell having said tap, processing for converting the tap of the cell to a conductivity type identical with that of a source diffusion region, and storing the cell obtained by the conversion in said extended cell library storage unit as an extended cell in which well potential of the cell has been freely set to any potential. Preferably, in the program according to the present invention, in the conversion of the tap of the cell to the conductivity type identical with that of the source diffusion region, said computer is caused to execute processing for generating the extended cell by replacing attribute information of the tap of the cell with attribute information of the source diffusion region.

The meritorious effects of the present invention are summarized as follows.

In accordance with the present invention, an existing cell having taps for supplying a power-supply potential and ground potential as well potentials is converted, whereby the cell can be replaced by a cell for supplying any potentials as the well potentials and effective utilization of cell library resources is made possible.

Further, according to the present invention, the burden involved in cell design can be suppressed by automatically making a conversion to a cell that supplies any potential as well potential.

Further, according to the present invention, an increase in chip area can be suppressed by placing an interconnect that supplies power-supply potential and a diffusion region that is connected to this interconnect by a contact at positions where they will overlap each other.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 1A and 1B are diagrams for describing an embodiment of the present invention;

FIGS. 5A and 5B are diagrams for describing another embodiment of the present invention;

FIGS. 6A, 6B and 6C are diagrams useful in describing layout data according to an embodiment of the present invention;

FIGS. 8A and 8B are diagrams schematically illustrating substitute cells according to an embodiment of the present invention;

FIG. 12 is a diagram illustrating the structure of a conventional cell having taps.

PREFERRED EMBODIMENTS OF THE INVENTION

Figure 2:
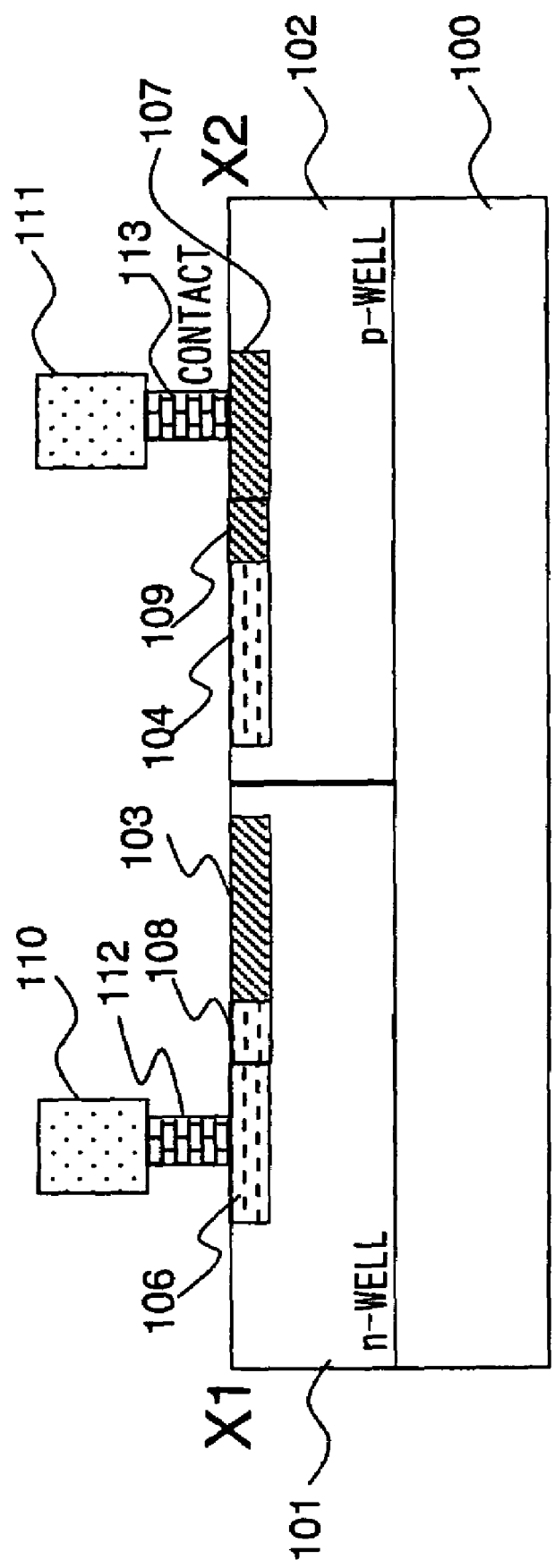
FIG. 2 is a cross-sectional view of FIG. 1A taken along line X1-X2.

Preferred embodiments of the present invention will now be described in detail with reference to the accompanying drawings.

The present invention inputs a cell having taps, which supply the potentials of wells in which active elements are formed, provided in a semiconductor substrate surface, converts the taps of the cell to a conductivity type identical with that of a source diffusion region, adopts these taps as new source regions and sets the well potentials of the cell freely to any potentials. This will be described in detail in accordance with embodiments that follow below.

FIG. 1A is a diagram illustrating the structure of a cell in which well potential is fixed at power-supply potential (ground potential). Although there is no particular limitation, FIGS. 1A and 1B illustrate cells having a twin-well configuration in which a semiconductor substrate is provided with an n-well and a p-well. It goes without saying that the present invention is not limited to such a twin-well configuration and can of course be applied to a CMOS in which a P-type substrate (p-substrate) is provided with an n-well. FIG. 1A illustrates the structure of a cell stored in a cell library of an apparatus that automatically designs a semiconductor device. The semiconductor device has a layered structure.

In FIG. 1A, a source/drain 103 comprising a P+ diffusion region (referred to as a "P+ diffusion layer") and a source/drain 104 comprising an N+ diffusion region (referred to as a "N+ diffusion layer") are provided in the surface within an n-well 101 and p-well 102, respectively. Gate electrodes 105 are arranged between the sources and drains via a gate oxide film (not shown) disposed on the substrate. The surface of the substrate is provided with taps 106 and 107 that bring the n-well potential to the power-supply potential VDD and the p-well potential to the ground potential GND, respectively. A shorting portion (N+ diffusion region) 108 electrically short-circuiting the tap 106 (N+ diffusion region) and source (P+ diffusion region) is provided in the n-well 101, and a shorting portion (N+ diffusion region) 109 electrically short-circuiting the tap 107 (P+ diffusion region) and source (N+ diffusion region) is provided in the p-well 102. It should be noted that information concerning the cell shown in FIG. 1A is registered in a cell library (cell library storage unit 10 in FIG. 10) of an apparatus that automatically designs semiconductor devices. Here the shorting portion (N+ diffusion region) 108 electrically short-circuiting the tap 106 and source can be regarded as part of the tap 106. On the other hand, if the shorting portion 108 is assumed to be a P+ diffusion region, then the shorting portion 108 can be considered as part of the source. The shorting portion (P+ diffusion region) 109 electrically short-circuiting the tap 107 and source can be regarded as part of the tap 107. On the other hand, if the shorting portion 109 is assumed to be an N+ diffusion region, then the shorting portion 109 can be considered as part of the source. Thus, the taps and sources are in contact at portions thereof (the P+ diffusion region and N+ diffusion region are formed so as to contact at portions thereof) and are shorted-circuited to each other as by a silicide process at the time of manufacture. Further, layout information in each layer can be generated automatically by extracting each layer (attribute), although this is not directly related to the subject matter of the present invention.

The present invention converts the cell of FIG. 1A, stored for example in a cell library, to thereby create a cell that makes is possible to supply any well potential.

FIG. 1B is a diagram illustrating the structure of a cell in which it has been made possible to supply any well potential by converting the cell shown in FIG. 1A.

As shown in FIG. 1B, the impurity diffusion region (N+ diffusion region) of tap 106 within the n-well 101 of FIG. 1A is made a P+ diffusion region, namely a diffusion region the conductivity type of which is opposite that in FIG. 1A, whereby a source region 103A is obtained, and the impurity diffusion region (P+ diffusion region) of tap 107 within the p-well 102 of FIG. 1A is made an N+ diffusion region, namely a diffusion region the conductivity type of which is opposite that in FIG. 1A, whereby a source region 104A is obtained. Shorting portions 108A and 109B are of conductivity types identical with those of the source regions 103A and 104A, respectively. The tap 106 (N+ diffusion region and contact) that supplies the n-well 101 with any well potential and the tap 107 (P+ diffusion region and contact) that supplies the p-well 102 with any well potential are provided on the outer sides (upper and lower sides in FIGS. 1A and 1B) of the source regions 103A and 103B, respectively. The taps 106 and 107 are supplied with any potentials (well potentials) from interconnects 114 and 115, which supplies any potentials, via contacts 116 and 117, respectively.

FIG. 2 is a cross-sectional view of FIG. 1A taken along line X1-X2. As shown in FIG. 2, the cell has a twin-well configuration in which a semiconductor substrate 100 is provided with the n-well 101 and p-well 102. In the n-well 101, the tap 106 (N+ diffusion region) and source 103 (P+ diffusion region) are connected by the shorting portion 108 (N+ diffusion region). In the p-well 102, the tap 107 (P+ diffusion region) and source 104 (N+ diffusion region) are connected by the shorting portion 109 (P+ diffusion region).

Figure 3:
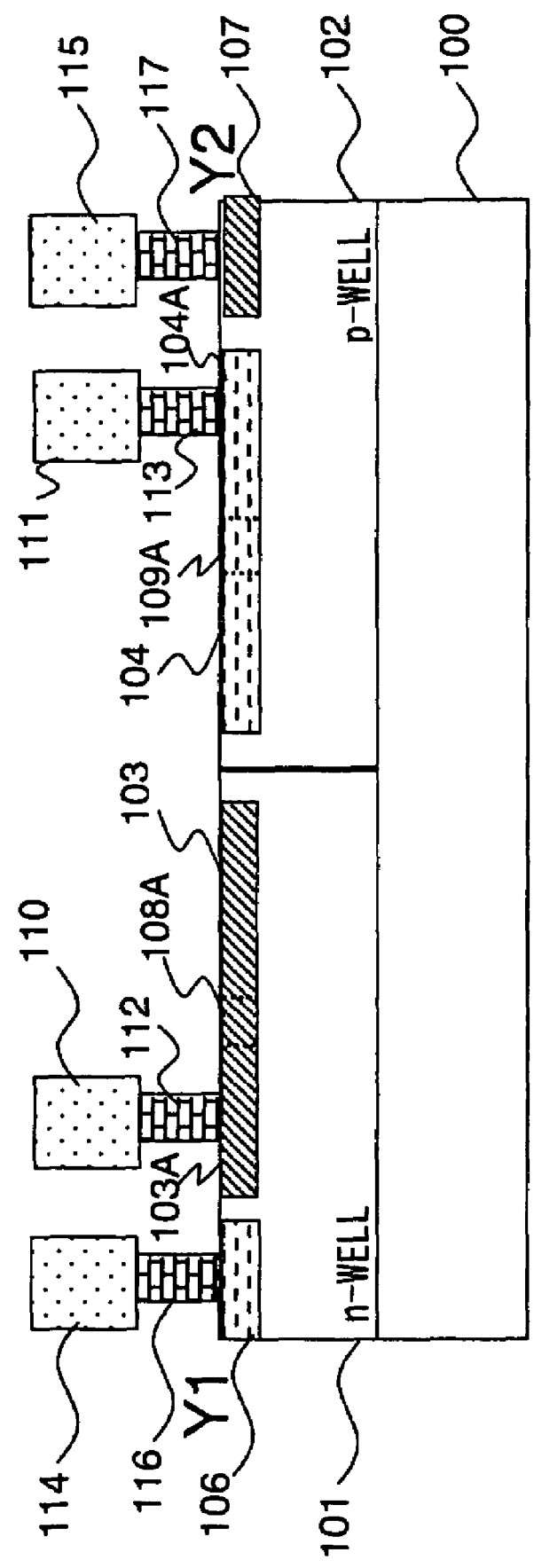
FIG. 3 is a cross-sectional view of FIG. 1B taken along line Y1-Y2.

FIG. 3 is a cross-sectional view of FIG. 1B taken along line Y1-Y2. As shown in FIG. 3, the cell has a twin-well configuration in which the semiconductor substrate 100 is provided with the n-well 101 and p-well 102. The source 103A (P+ diffusion region) in the n-well 101 is supplied with the power-supply potential VDD from the power supply interconnect 110 via the contact 112, and the source 103A (P+ diffusion region) is connected to the source 103 (P+ diffusion region) of the MOS transistor via the shorting portion 108A (P+ diffusion region). The source 104A (N+ diffusion region) in the p-well 102 is supplied with the ground potential GND from the power supply interconnect 111 via the contact 113, and the source 104A (N+ diffusion region) is connected to the source 104 (N+ diffusion region) of the MOS transistor via the shorting portion 109A (N+ diffusion region). In the n-well 101, the tap 106 (N+ diffusion region) is disposed outside the source 103A and is supplied with any potential via the interconnect 114 and contact 116. In the p-well 102, the tap 107 (N+ diffusion region) is disposed outside the source 104A and is supplied with any potential via the interconnect 115 and contact 117. The cell having the structure shown in FIG. 1B and FIG. 3 is obtained by automatically converting the cell of FIG. 1A and FIG. 2 in a manner described later. That is, the design process and TAT of a cell in which a well is supplied with any potential are shortened greatly and the cell library can be utilized effectively.

In this embodiment, it may be so arranged that the cell of FIG. 1A and the cell of FIG. 1B (the cell that results after the taps are converted to the source diffusion regions) may be mixed together and laid out. In such case it is preferred that use be made of a technique in which a macro is formed in a certain region by a cell (see FIG. 1B) that is the result of converting the taps to the source diffusion regions, and a macro is formed in another region by a cell (see FIG. 1B) that prevails before the tap conversion.

Figure 4:
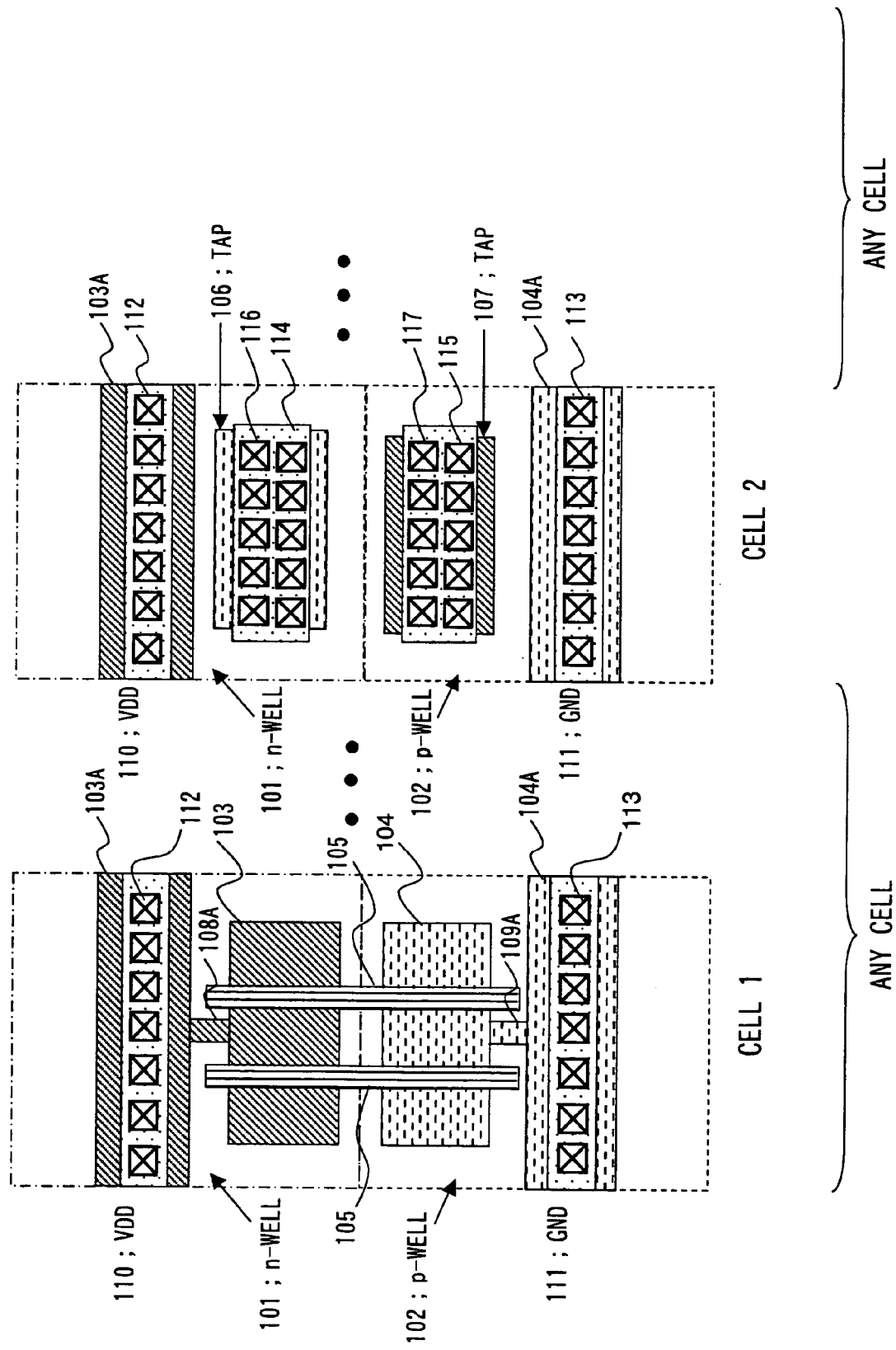
FIG. 4 is a diagram schematically illustrating a cell row according to an embodiment of the present invention.

FIG. 4 is a diagram illustrating the layout of another embodiment of the present invention. This shows two cells (cell 1 and cell 2) among a plurality of cells that have been laid out in one row. Cell 1 in FIG. 4 is the cell of FIG. 1B, and cell 2 is a tap cell for supplying wells with any potentials. That is, at least one tap cell is laid out in one row of cells. More specifically, in cell 1 in FIG. 4, the shorting portion 108A that connects the source diffusion region of source/drain 103 in the n-well 101 with the source diffusion region 103A comprises a P+ diffusion region, and the shorting portion 109A that connects the source diffusion region of source/drain 104 in the p-well 102 with the source diffusion region 104A comprises an N+ diffusion region. Tap cell 2 has taps 106 and 107 that supply the n-well 101 and p-well 102 with any potentials. Thus, the tap cell may be placed between cells in a cell row. In cell 2, the tap 106 comprises the N+ diffusion region and contact 116 and is supplied with any potential from an interconnect 114. The tap 107 comprises the P+ diffusion region and contact 117 and is supplied with any potential from an interconnect 115. That is, the n-well 101 and p-well 102 are supplied with any potentials from the interconnects 114 and 115, respectively.

Further, in the arrangement shown in FIG. 4, the sources 103A of n-wells 101 and the sources 104a of p-wells 102 continue in common in the cell row (cell 1, cell 2, ...) and are connected to the power supply interconnect 110 and ground interconnect 111 via the contacts 112 and 113, respectively. In cell 1, the VDD and GND potentials are supplied to the sources of the source/drains 103 and 104, respectively, via the shorting portions 108A and 109A, respectively. The power supply interconnect 110 and of the ground interconnect 111 are placed at positions where they overlap the sources 103A and 104A, respectively. An arrangement may be adopted in which a circuit block that includes the cell of FIG. 1A (namely the cell in which the well potentials are the VDD and GND potentials) and a block that includes the cell of FIG. 1B (namely the cell in which the well potentials are any potentials) are placed in the same row.

FIGS. 5A and 5B are diagrams illustrating another embodiment of the present invention. FIG. 5A is a diagram illustrating the structure of a cell in which well potential is fixed at power-supply potential. A cell A (see FIG. 5C) comprises an N+ diffusion region and a contact and constitutes the tap 106 that supplies the n-well 101 with the power-supply potential VDD. A plurality of these unit cells A are arrayed in a single row. A cell B (see FIG. 5D) comprises a P+ diffusion region and a contact and constitutes the tap 107 that supplies the p-well 102 with the ground potential GND. A plurality of these unit cells B are arrayed in a single row.

The cell shown in FIG. 5B is obtained by converting the cell of FIG. 5A to a structure that applies any potential in accordance with the present invention. As shown in FIG. 5B, the cell B (see FIG. 5D) comprising a P+ diffusion region and a contact is used as the source 103A of the n-well 101. The cell A (see FIG. 5C) comprising the N+ diffusion region and contact is used as the source 104A of the p-well 102.

Furthermore, the cell A (see FIG. 5C) comprising the N+ diffusion region and contact is utilized as the tap cell 106 of the n-well, and the cell B (see FIG. 5D) comprising the P+ diffusion region and contact is utilized as the tap cell 107 of the p-well. In the example shown in FIG. 5A, the cells A, B constituting the taps 106 and 107 are all disposed in the tap regions (nine are disposed in FIGS. 5A, 5B). There may be vacancies, however, as a matter of course.

FIGS. 6A, 6B and 6C are diagrams useful in describing layout data according to an embodiment of the present invention. The layout data of a cell library is composed of graphic information having layer attributes. In this embodiment, the library has layer information as attributes. First to sixth layers comprise a p-well, n-well, P+ diffusion layer, N+ diffusion layer, polysilicon and contact, respectively. An 11$^{th}$ layer a metal 1 (first metal interconnect layer). In a case where a conversion is made from the cell of FIG. 1A to the cell of FIG. 1B, a conversion is made from an N+ diffusion layer to a P+ diffusion layer with regard to the attributes of tap 106 in FIG. 1A. In this case, as shown in FIG. 6, the fourth layer (N+ diffusion layer) constituting the attribute of the taps of FIG. 1A is replaced by the third layer (P+ diffusion layer) to thereby achieve the conversion to the source 103A of the cell shown in FIG. 1B.

Figure 7:
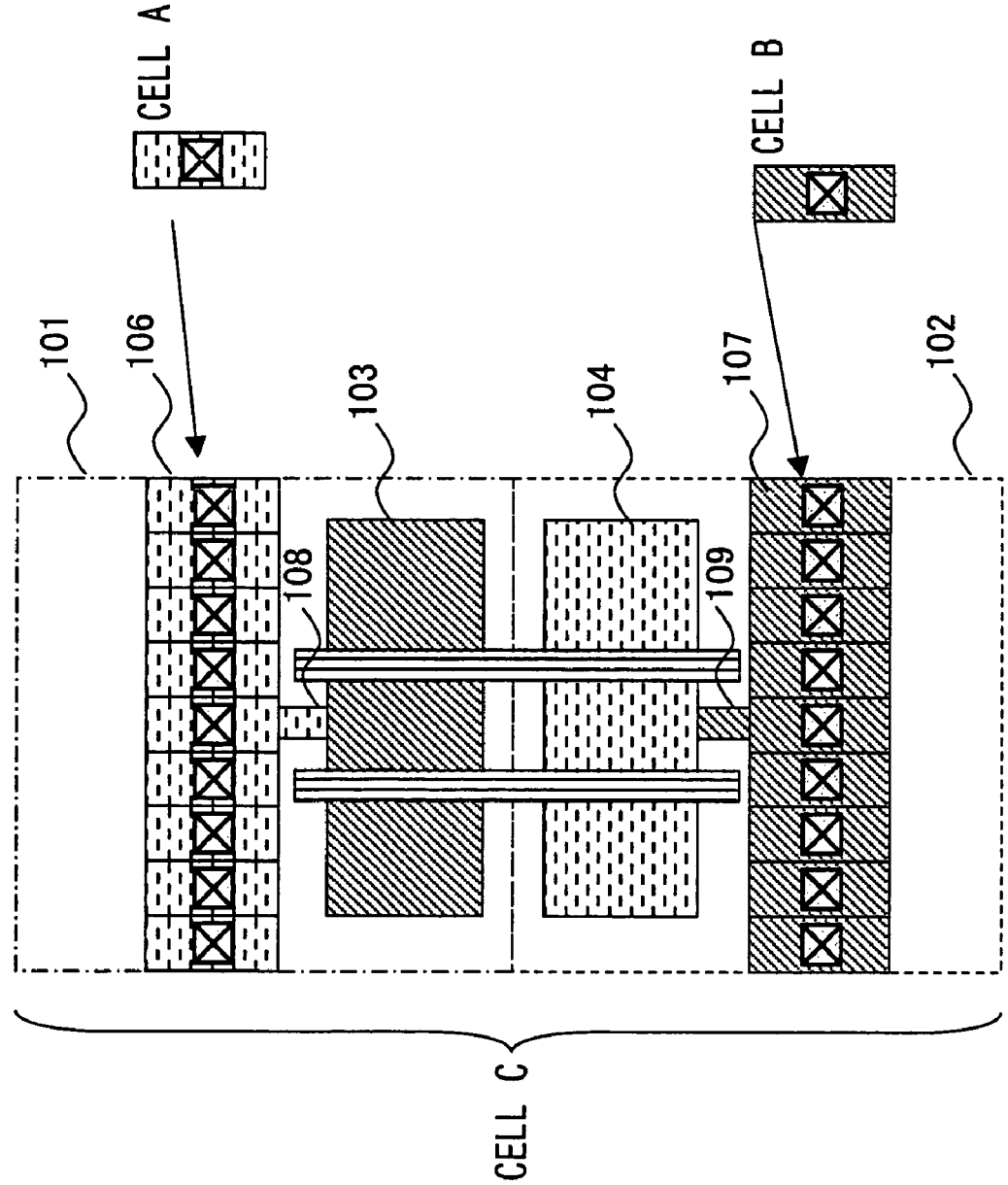
FIG. 7 is a diagram useful in describing the layered structure of layout data according to an embodiment of the present invention.

In this embodiment, the layout data can take on a layered structure in the manner shown in FIG. 7. For example, a cell C (a tap cell in which a well is supplied with the power-supply potential VDD) is such that a plurality of the cells A comprising the N+ diffusion region and contact are arranged in a single row to construct the tap 106 of the n-well, and a plurality of the cells B comprising the P+ diffusion region and contact are arranged in a single row to construct the tap 107 of the p-well.

Figure 9:
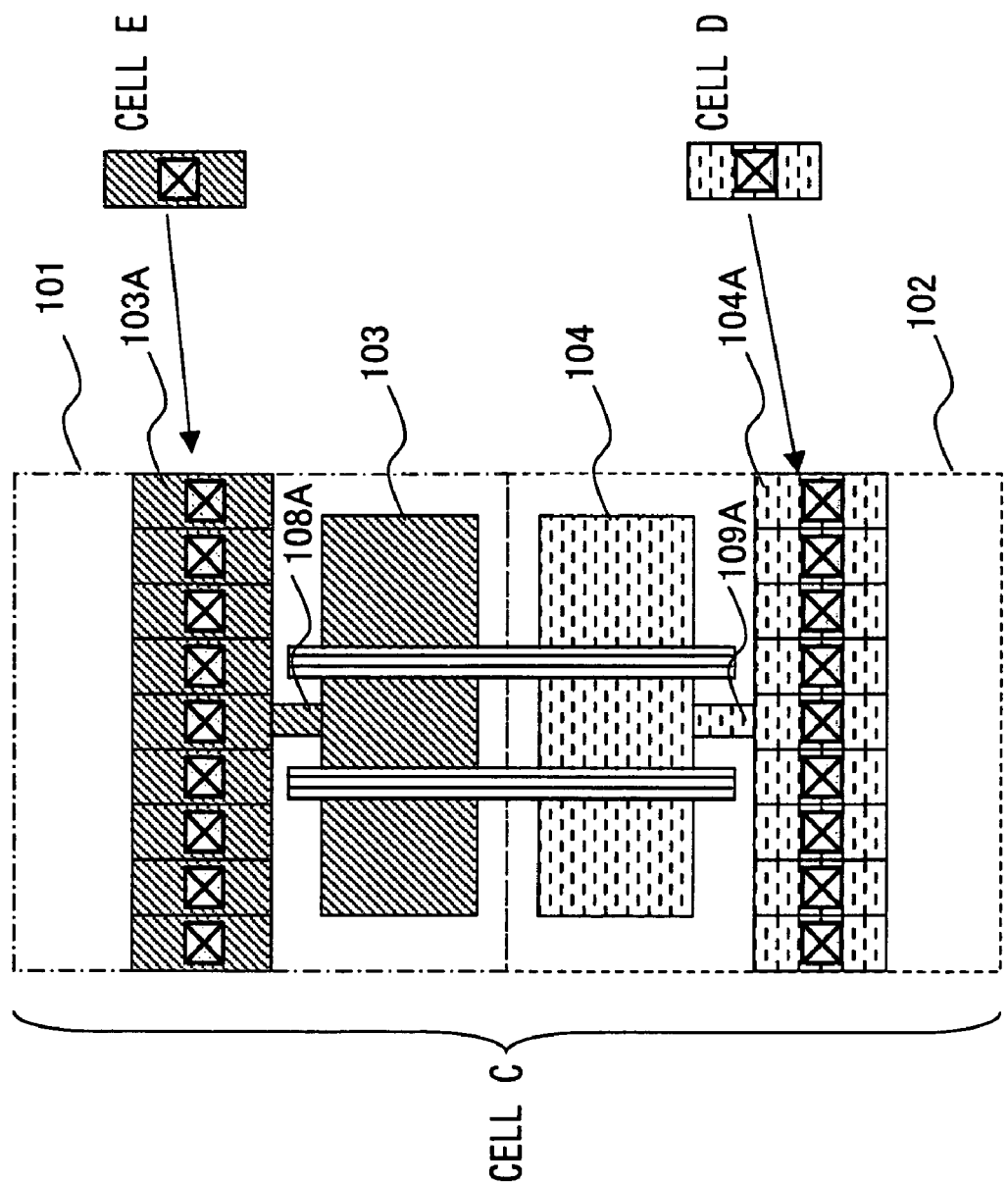
FIG. 9 is a diagram illustrating layout data of a cell after substitution according to an embodiment of the present invention.

With regard to the cells of FIG. 7, if the cell A comprising the N+ diffusion region and contact is replaced by a cell E (see FIG. 8B) comprising a P+ diffusion region and contact and the cell B comprising the P+ diffusion region and contact is replaced by a cell D (see FIG. 8A) comprising an N+ diffusion region and contact, then layout data of a cell of the kind shown in FIG. 9 will be obtained. That is, a cell in which the taps that apply the well potentials are replaced by sources is obtained.

Figure 10:
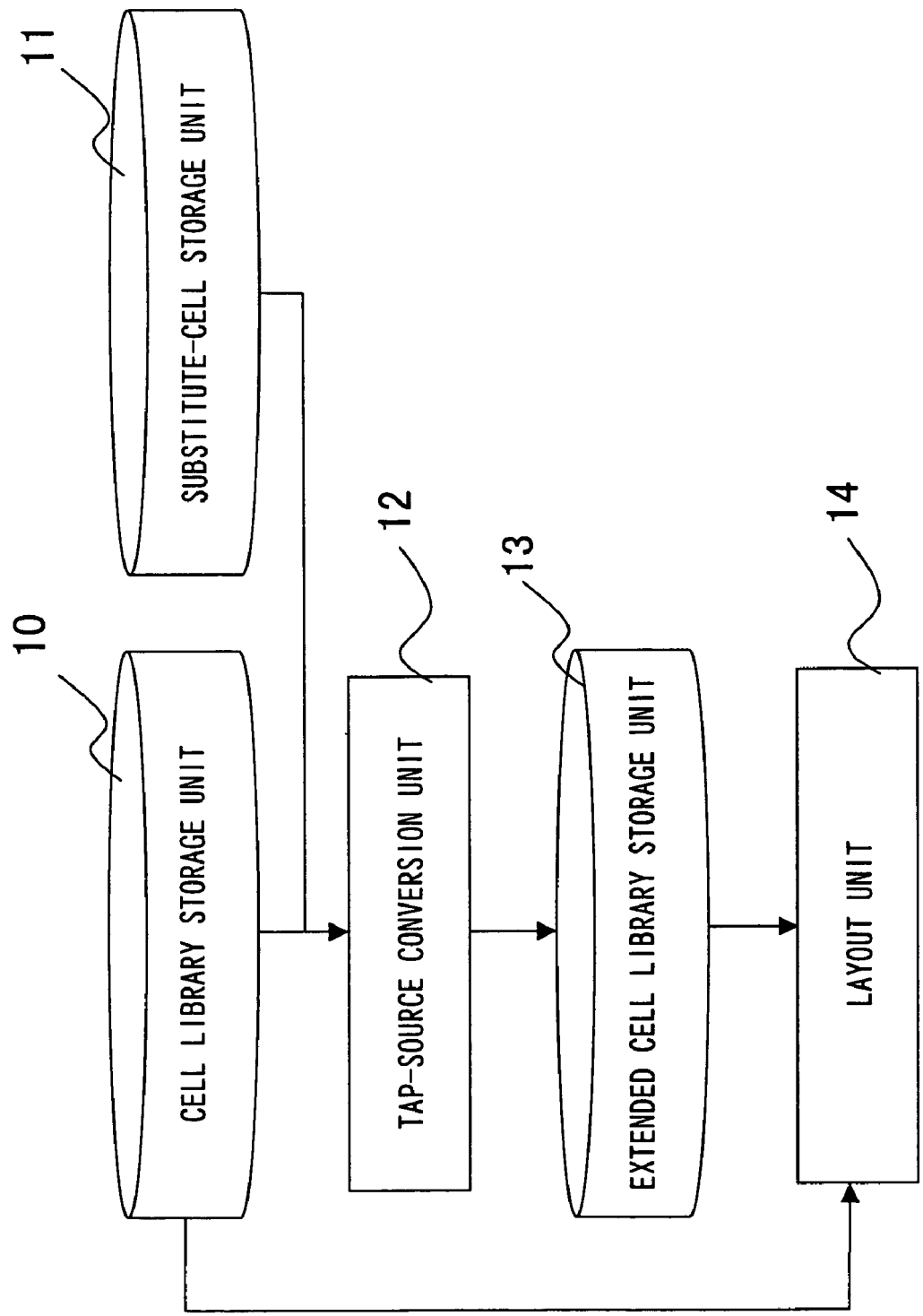
FIG. 10 is a diagram illustrating the structure and processing procedure of an apparatus for automatically designing a semiconductor according to an embodiment of the present invention.

Next, a method and system for changing a cell according to an embodiment of the present invention will be described. FIG. 10 is a diagram illustrating the structure of an apparatus according to this embodiment. Cells having layout data (which possesses layer information as attributes and takes on a layered structure) illustrated by way of example in FIG. 7, etc., have been stored in the cell library storage unit 10.

Substitute cells (e.g., see FIGS. 8A and 8B) have been stored in a substitute-cell storage unit 11.

A Tap-source conversion unit 12 reads out cell information that has been stored in the cell library storage unit 10, searches for a cell that includes taps that apply well potentials and replaces this cell with a substitute cell (see FIGS. 8A and 8B) the conductivity type of the impurity diffusion region of which is opposite that of the taps.

Here the tap-source conversion unit 12 searches the cell information to determine whether an impurity diffusion region of the same conductivity type as that of the well has a portion to which power-supplying metal interconnect and a contact have been connected and, if an impurity diffusion region of the same conductivity type as that of the well has a portion to which a power-supply metal interconnect and a contact have been connected exists, determines that this portion is a tap. Taking the case shown in FIG. 7 as an example, the portion 106, which has a conductivity type (N+ diffusion layer) the same as that of n-well 101 and connects the cells A to which a power-supplying metal interconnect and a contact have been connected, is retrieved as a tap. With regard also to the p-well, the array of cells B is retrieved as tap 107.

The tap-source conversion unit 12 replaces cell A of FIG. 7 with cell E (see FIG. 8B) comprising the P+ diffusion region and contact, and replaces cell B, which comprises the P+ diffusion region and contact, with cell D (see FIG. 8A) comprising the N+ diffusion region and contact. Further, in a case where the shorting portions 108 and 109 of FIG. 7 have a conductivity type that is opposite that of the source/drain, the shorting portions 108A and 109A of FIG. 9 are obtained by adopting a doping impurity of the opposite conductivity type.

Further, in may be so arranged that a tap is added on anew in order to supply well potential independently of the source potential.

The substituted cell is stored in an extended cell library storage unit 13. In a case where a cell that supplies any potentials to wells is laid out, a layout unit (a layout tool) 14 executes layout using the layout data (e.g., see FIG. 1B) of the cell that has been stored in the extended cell library storage unit 13. In a case where a cell that supplies fixed potential to wells is laid out, then the layout unit 14 executes layout using layout data (e.g., see FIG. 1A) of a cell that has been stored in the cell library storage unit 10.

It should be noted that the system shown in FIG. 10 can be bundled in a computer system [an EWS (Engineering Work Station) equipped with an input/output unit and storage, etc., or a personal computer] that implements an apparatus for automatically designing a semiconductor and can be implemented by computer-software control.

Figure 11A:
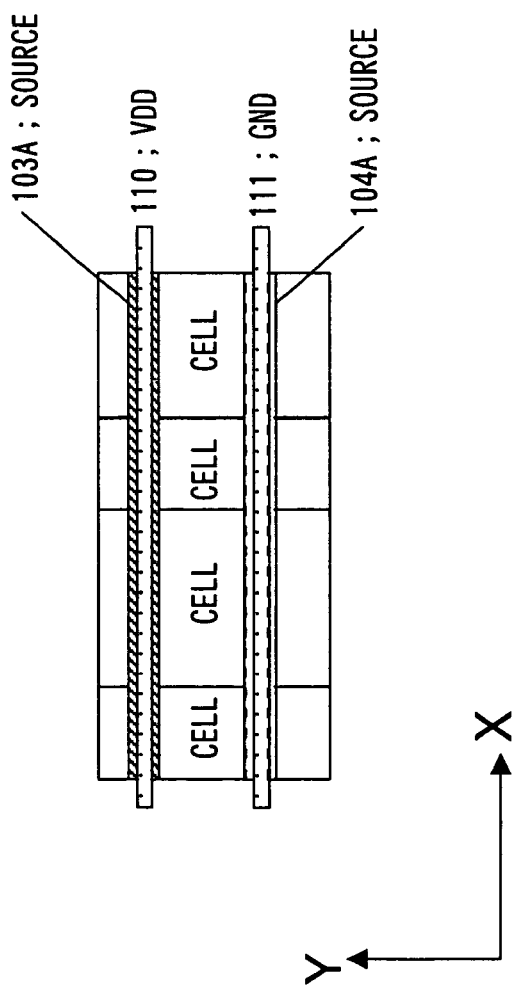
FIGS. 11A and 11B are diagrams illustrating the structure of another embodiment of the present invention.
Figure 11B:
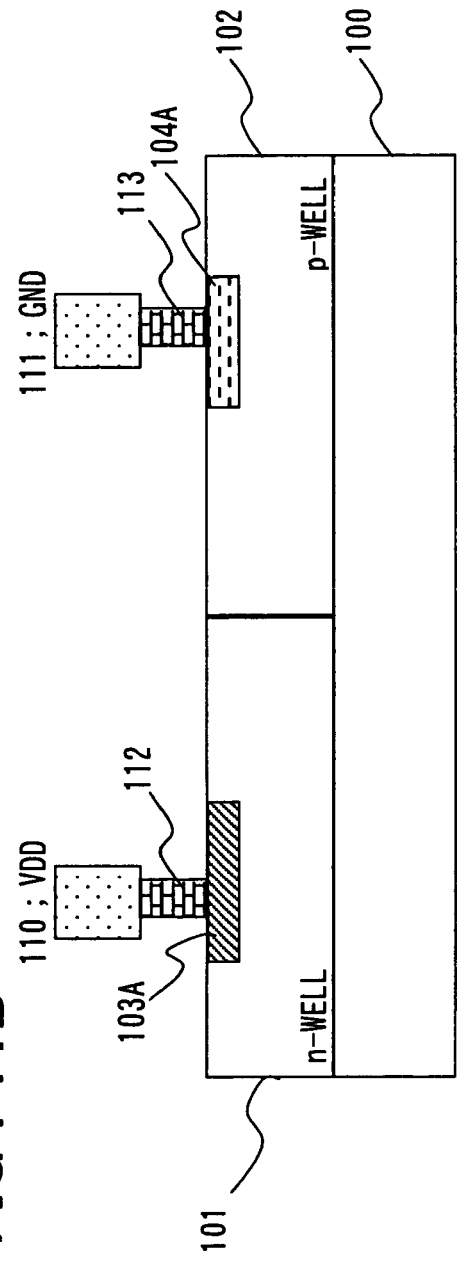

FIGS. 11A and 11B are diagrams illustrating the structure of another embodiment of the present invention. As shown in FIG. 11A, sources 103A and 104A (e.g., see FIG. 1B and FIG. 4, etc.) and power supply interconnects 110 and 111 (VDD or GND, or both VDD and GND) that supply source potential are laid out continuously between adjacent cells and overlap each other as seen from above the substrate surface.

FIG. 11B is a cross-sectional view taken along direction Y of FIG. 11A. As shown in FIG. 11B, source 103A of n-well 101 and VDD interconnect 110 are laid out so as to overlap each other, and source 104A of p-well 102 and GND interconnect 111 are laid out so as to overlap each other. An increase in chip area is suppressed by such a structure.

As many apparently widely different embodiments of the present invention can be made without departing from the spirit and scope thereof, it is to be understood that the invention is not limited to the specific embodiments thereof except as defined in the appended claims.

Still other objects and advantages of the present invention will become readily apparent to those skilled in this art from the following detailed description, wherein only the preferred embodiment of the invention is shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit device, comprising:
a second cell, including:
a well formed in a substrate;
a converted tap converted from a tap of a first cell in a cell library; and
a source diffusion region of an active element formed in said well, a conductivity type of said converted tap being identical with that of said source diffusion region; and
wherein the conductivity type of the converted tap is identical with a conductivity type of a source diffusion region of the first cell, said first cell including:
a well formed in a substrate;
the tap for supplying a potential of said well of the first cell; and
the source diffusion region of the first cell comprising an active element formed in said well of the first cell and having a conductivity type opposite that of said well of the first cell,
wherein, within the second cell, an impurity diffusion region that constitutes said converted tap extends to said source diffusion region of the second cell to electrically connect the converted tap to at least a portion of said source diffusion region of the second cell.

2. The device according to claim 1, wherein said second cell further comprises another tap for supplying a potential of said well in said second cell, at a position separate from that of said converted tap replaced by said source diffusion region.

3. The device according to claim 2, wherein the another tap of the second cell is configured to supply the well of the second cell with any well potential.

4. The device according to claim 1, further comprising a tap cell which supplies a potential of said well of the second cell, separate from said second cell.

5. The device according to claim 1, wherein said tap in said first cell comprises one or a plurality of tap cells each having an impurity diffusion region and a contact; and
said second cell is such that said tap cell in said first cell is replaced by a substitute tap cell having an impurity diffusion region a conductivity type of which is identical with that of said source diffusion region, and a contact.

6. The device according to claim 1, wherein within said first cell, an impurity diffusion region that constitutes said tap extends to said source diffusion region of the first cell to contact the tap to said source diffusion region of the first cell at least at one portion thereof.

7. The device according to claim 1, wherein an interconnect, which is laid on an interconnect layer provided on an upper layer of the substrate and supplies said source diffusion region with power-supply potential, is disposed so as to overlap said source diffusion region and seen from above the substrate,
wherein said interconnect that supplies said source diffusion region with the power-supply potential and said source diffusion region are disposed to extend over a plurality of mutually adjacent cells and
wherein the tap that supplies the potential of said well of the second cell is freely supplied with a potential different from a potential supplied to said source diffusion region of the second cell.

8. The device according to claim 1, wherein the second cell further comprises a shorting region connecting and having the same conductivity type and polarity as the converted tap and the source diffusion region of the second cell.

9. The device according to claim 1, wherein the first cell further comprises a shorting region connecting, and having the same conductivity type as one of, the tap and the source diffusion region of the first cell.

10. The device according to claim 1, wherein the tap exclusively electrically connects said source diffusion region of the first cell to outside of the first cell, and
wherein a polarity of the converted tap is identical with a polarity of the source diffusion region of the first cell.

11. A semiconductor integrated circuit device comprising:
a first cell; and
a second cell, including:
a well formed in a substrate;
a converted tap converted from a tap of the first cell in a cell library; and
a source diffusion region of an active element formed in said well, a conductivity type of said converted tap being identical with that of said source diffusion region,
wherein, the conductivity type of the converted tap is identical with that of a source diffusion region of the first cell, said first cell including:
a well formed in a substrate;
the tap for supplying a potential of said well of the first cell; and
the source diffusion region of the first cell comprising an active element formed in said well of the first cell and having a conductivity type opposite that of said well of the first cell,
wherein, within the second cell, an impurity diffusion region that constitutes said converted tap extends to said source diffusion region of the second cell to electrically connect the converted tap to at least a portion of said source diffusion region of the second cell.

12. The device according to claim 11, wherein the second cell further comprises a shorting region connecting and having the same conductivity type and polarity as the converted tap and the source diffusion region of the second cell.

13. The device according to claim 11, wherein the first cell further comprises a shorting region connecting, and having the same conductivity type as one of, the tap and the source diffusion region of the first cell.

14. The device according to claim 11, wherein within the first cell, an impurity diffusion region that constitutes the tap of the first cell extends to said source diffusion region of the first cell to electrically connect the tap to at least a portion of the source diffusion region of the first cell.

15. The device according to claim 11, wherein said second cell further comprises another tap for supplying the potential of said well in said second cell, at a position separate from that of said converted tap replaced by said source diffusion region of the second cell.

16. The device according to claim 15, wherein the another tap of the second cell is configured to supply the well of the second cell with any well potential.

17. The device according to claim 11, further comprising a tap cell which supplies a potential of said well of the second cell, separate from said second cell.

18. The device according to claim 11, wherein said tap in said first cell comprises one or a plurality of tap cells each having an impurity diffusion region and a contact, and
wherein said second cell is such that said tap cell in said first cell is replaced by a substitute tap cell having an impurity diffusion region the conductivity type of which is identical with that of said source diffusion region of the first cell, and the contact.

19. The device according to claim 11, wherein an interconnect that is formed on an interconnect layer provided on an upper layer of the substrate and that supplies said source diffusion region of the second cell with power-supply potential is disposed so as to overlap said source diffusion region of the second cell and seen from above the substrate,
wherein said interconnect that supplies said source diffusion region of the second cell with the power-supply potential and said source diffusion region of the second cell are disposed to extend over a plurality of mutually adjacent cells, and
wherein the tap that supplies the potential of said well of the second cell is freely supplied with a potential different from the potential supplied to said source diffusion region of the second cell.

20. The device according to claim 11, wherein the tap exclusively electrically connects said source diffusion region of the first cell to outside of the first cell, and
wherein a polarity of the converted tap is identical with a polarity of the source diffusion region of the first cell.

* * * * *